US009691752B1

United States Patent
Chao et al.

(10) Patent No.: US 9,691,752 B1
(45) Date of Patent: Jun. 27, 2017

(54) SEMICONDUCTOR DEVICE FOR ELECTROSTATIC DISCHARGE PROTECTION AND METHOD OF FORMING THE SAME

(71) Applicant: UNITED MICROELECTRONICS CORP., Hsin-Chu (TW)

(72) Inventors: Mei-Ling Chao, Hsinchu (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/096,234

(22) Filed: Apr. 11, 2016

(51) Int. Cl.
*H01L 27/02* (2006.01)
*H01L 29/06* (2006.01)

(52) U.S. Cl.
CPC ...... *H01L 27/0255* (2013.01); *H01L 27/0259* (2013.01); *H01L 29/0619* (2013.01); *H01L 29/0653* (2013.01)

(58) Field of Classification Search
CPC ............. H01L 27/0255; H01L 27/0259; H01L 29/0169; H01L 29/0653
See application file for complete search history.

(56) References Cited

U.S. PATENT DOCUMENTS

| 6,329,694 B1* | 12/2001 | Lee | H01L 27/0266 257/173 |
| 7,026,650 B2* | 4/2006 | Ryu | H01L 29/1608 257/408 |
| 8,492,834 B2 | 7/2013 | Lai et al. | |
| 2009/0020811 A1* | 1/2009 | Voldman | H01L 29/0619 257/337 |
| 2013/0207184 A1* | 8/2013 | Chen | H01L 29/7835 257/339 |
| 2014/0183596 A1* | 7/2014 | Wang | H01L 29/7436 257/141 |
| 2014/0284728 A1* | 9/2014 | Wu | H01L 21/2855 257/412 |
| 2015/0179779 A1 | 6/2015 | Liao | |

* cited by examiner

*Primary Examiner* — Christine Enad
(74) *Attorney, Agent, or Firm* — Winston Hsu

(57) ABSTRACT

An ESD protection device and a method of forming the same, the ESD device includes a substrate, a first doped well, a second doped well, a source and drain regions and a guard ring. The first doped well with a first conductive type is disposed in the substrate. The source and drain regions with the second conductive type are disposed in the first doped well. The guard ring with the first conductive type is also disposed in the first doped well and has a first portion extending along a first direction and a second portion extending along a second direction different from the first direction. The second doped well with the second conductive type is also disposed in the first doped well between the drain region and the second portion of the guard ring to in contact with the drain region in the first direction.

20 Claims, 4 Drawing Sheets

SEMICONDUCTOR DEVICE FOR ELECTROSTATIC DISCHARGE PROTECTION AND METHOD OF FORMING THE SAME

BACKGROUND OF THE INVENTION

1. Field of the Invention

The present invention relates to a semiconductor device and a method of forming the same, and more particular, to a semiconductor device for electrostatic discharge protection and a method of forming the same.

2. Description of the Prior Art

Electrostatic discharge (ESD) is a transient process of high energy transformation from external to internal of an integrated circuit (IC), which may temporarily disable or permanently destroy the electronic systems, thereby adversely damaging to the ICs. Therefore, an ESD protection device is designed to provide a discharge path and to protect the ICs from being blown out by instantaneous discharge currents.

Current ESD protection device includes a bipolar transistor (BJT) formed by a source region, a drain region and an anti-type doped well disposed in a substrate, and which is usually surrounded by a guard ring. However, due to the structural arrangement according to the practical requirements, diverse distances may be formed between different parts of the drain region and the guard ring. Since MM (machine model) ESD waveform consists of both positive and negative sinusoidal peaks that decay exponentially, more charges may accumulate at the parts of the drain region which is relatively closer to the guard ring during the first negative peak. Accordingly, during the positive peak next to the first negative peak, the parts of the drain region relatively closer to the guard ring are turned on faster than the other parts of the drain region, thereby resulting in non-uniform turn on issue. Thus, these parts of the drain region closer to the guard ring are easily damaged due to such non-uniform turn on issue. Hence, how to improve current ESD protection device has become an important task in this field.

SUMMARY OF THE INVENTION

In order to solve the above-mentioned issues, the present invention therefore provides an electrostatic discharge (ESD) protection device and a method of forming the same, in which the current paths around the drain region enable to be turned on uniformly.

To achieve the purpose described above, the present invention provides an ESD protection device including a substrate, a first doped well, a second doped well, a source region and a drain region, and a guard ring. The first doped well is disposed in the substrate and has a first conductive type. The drain region is disposed in the first doped well and has a second conductive type. The guard ring is disposed in the first doped well and has the first conductive type, wherein the guard ring surrounds the drain region and has a first portion extending along a first direction and a second portion extending along a second direction different from the first direction. The source region is disposed in the first doped well between the drain region and the first portion of the guard ring, and has the second conductive type. The second doped well is disposed in the first doped well between the drain region and the second portion of the guard ring, and has the second conductive type, wherein the second doped well is in contact with the drain region in the first direction.

To achieve the purpose described above, the present invention provides a method of forming an ESD protection device including the following steps. First of all, a substrate is provided. Next, a first doped well with a first conductive type is formed in the substrate, and a drain region with a second conductive type is formed in the first doped well. Then, a guard ring with the first conductive type in formed in the first doped well to surround the drain region, wherein the guard ring has a first portion extending along a first direction and a second portion extending along a second direction different from the first direction. Afterward, a source region with the second conductive type is formed in the first doped well between the drain region and the first portion of the guard ring. Finally, a second doped well with the second conductive type is formed in the first doped well between the second portion of the guard ring and the drain region, wherein the second doped well is in contact with the drain region in the first direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-2 are schematic diagrams illustrating an electrostatic discharge (ESD) protection device according to a first preferred embodiment of the present invention, in which:

FIG. 1 shows a top view of an ESD protection device according to the first preferred embodiment of the present invention; and FIG. 2 shows a cross-sectional view of an ESD protection device taken along a line A-A' in FIG. 1.

FIGS. 3-5 are schematic diagrams illustrating a fabricating method of an ESD protection device according to the present invention, in which:

FIG. 3 shows a cross-sectional view of an ESD protection device after forming a plurality of doped wells;

FIG. 4 shows a cross-sectional view of an ESD protection device after forming a plurality of first doped regions;

FIG. 5 shows a cross-sectional view of an ESD protection device after forming a plurality of second doped regions.

FIGS. 6-7 are schematic diagrams illustrating an electrostatic discharge (ESD) protection device according to a second preferred embodiment of the present invention, in which:

FIG. 6 shows a top view of an ESD protection device according to the second preferred embodiment of the present invention; and FIG. 7 shows a cross-sectional view of an ESD protection device taken along a line B-B' in FIG. 6.

DETAILED DESCRIPTION

To provide a better understanding of the present invention, preferred embodiments will be described in detail. The preferred embodiments of the present invention are illustrated in the accompanying drawings with numbered elements.

Figure 1:
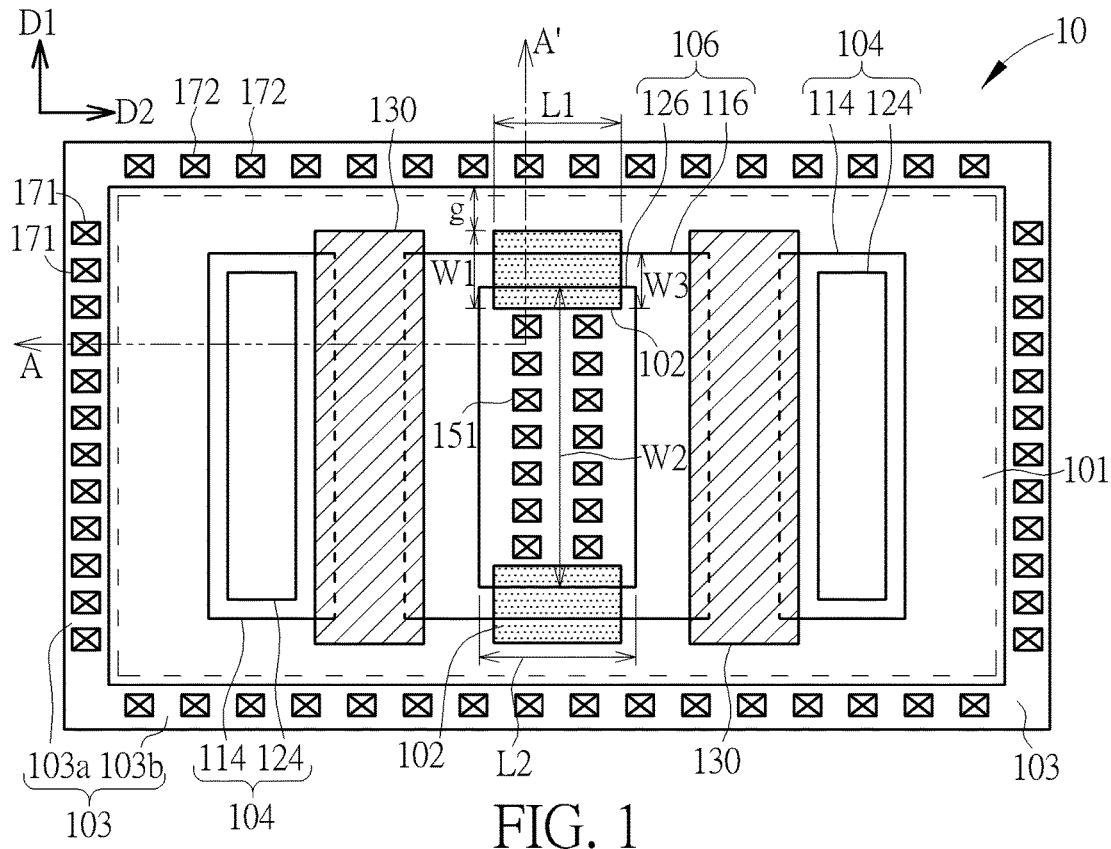
Figure 2:
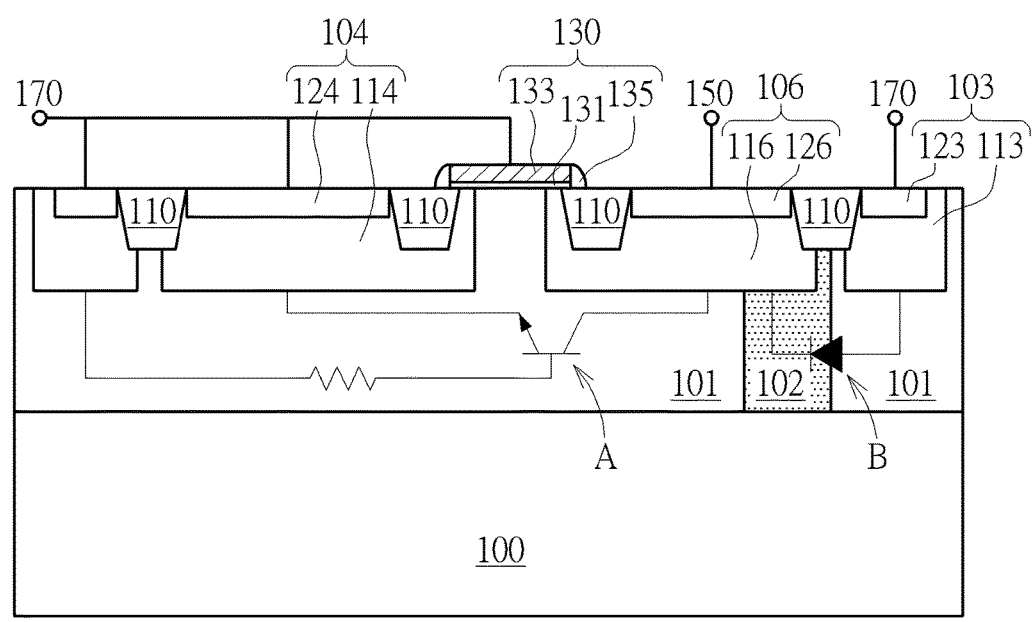

Please refer to FIG. 1 to FIG. 2, which show schematic diagrams of an electrostatic discharge (ESD) protection device according to the first embodiment of the present invention. As shown in FIGS. 1-2, the ESD protection device 10 includes a substrate 100, a first doped well 101, a second doped well 102, a source region 104 and a drain region 106. The substrate 100 for example includes a silicon substrate, a silicon-included substrate, a silicon-on-insulator (SOI) substrate or other semiconductor substrates, and may have p-type or n-type. The first doped well 101 is disposed in the substrate 100 and has a first conductive type such as p-type, such that, the first doped well 101 may serve as a high-voltage p well (HVPW).

The guard ring 103 is disposed in the first doped well 101 and includes the first conductive type. The source region 104 and the drain region 106 are also disposed in the first doped well 101 and have a second conductive type, such as n-type. However, in another embodiment, the source region and the drain region may also be p-type while the guard ring and the first doped well is n-type. The guard ring 103 is used to electrically isolate the ESD protection device 10 from other devices disposed in the same substrate 100 or in the same first doped well 101 through the substrate 100 or the first doped well 101. The guard ring 103 surrounds the source region 104 and the drain region 106. Specifically, the guard ring 103 includes a first portion 103a extending along a first direction D1 such as the y-direction and a second portion 103b extending along a second direction D2 different from the first direction D1, such as the x-direction, but is not limited thereto. The ESD protection device 10 may further include at least one first contact plug 171 and at least one second contact plug 172. The first contact plug 171 is disposed on the first portion 103a of the guard ring 103 to be electrically connected to the first portion 103a of the guard ring 103, and the second contact plug 172 is disposed on the second portion 103b of the guard ring 103 to be electrically connected to the second portion 103b of the guard ring 103. In this embodiment, the guard ring 103 may include two first portions 103a opposite to each other and two second portions 103b opposite to each other. Also, the numbers of the first contact plug 171 and the second contact plug 172 may be plural respectively to reduce the resistance between the guard ring 103 and outer pads.

In one embodiment, the guard ring 103 may further include a third doped region 113 to serve as a high-voltage p-field (HVPF) region, and a fourth doped region 123 disposed in the third doped region 113 of the guard ring 103 to serve as a p+ region as shown in FIG. 2. Also, the third doped region 113 of the guard ring 103 includes a doped concentration greater than a doped concentration of the first doped well 101 and less than a doped concentration of the fourth doped region 123.

The source region 104 and the drain region 106 are both disposed in the first doped well 101 and are separated from each other. That is, the first doped well 101 surrounds the source regions 104 and the drain region 106. In this embodiment, the ESD protection device 10 includes two source regions 104 disposed between the drain region 106 and the two first portions 103a of the guard ring 103 respectively. The two source regions 104 and the drain region 106 have a stripe-like-shape and are all disposed along the first direction D1, for example being parallel to the first portion 103a of the guard ring 103 as shown in FIG. 1. However, in another embodiment, the source region and the drain region may also have different shapes like a circular shape, but not limited thereto. Furthermore, the ESD protection device 10 may further include at least one contact plug 151 disposed on the drain region 106 to be electrically connected thereto.

In one embodiment, each of the source regions 104 may further include a first doped region 114 to serve as a high-voltage n-field (HVNF) region and a second doped region 124 disposed in the first doped regions 114 of the source region 104 to serve as an n+ region; and the drain region 106 may further include a first doped region 116 to serve as a high-voltage n-field (HVNF) region and a second doped region 126 disposed in the first doped regions 116 of the drain region 106 to serve as an n+ region, as shown in FIG. 2. Also, the first doped regions 114, 116 of the source regions 104 and the drain region 106 include a doped concentration smaller than a doped concentration of the second doped regions 124, 126 of the source regions 104 and the drain region 106.

The second doped well 102 is also disposed in the first doped well 101 between the second portion 103b of the guard ring 103 and the drain region 106. The second doped wells 102 includes the second conductive type, and includes a doped concentration smaller than the doped concentration of the drain region 106 and the source regions 104. In one embodiment, the doping concentration of the second doped wells 102 may be from $10^{17}$ to $10^{19}$ cm$^{-3}$, and the doped concentration of the first region 116 of the drain region 106 or first region 114 of the source regions 104 may be from $10^{19}$ to $10^{21}$ cm$^{-3}$, but not limited thereto. In this embodiment, two second doped wells 102 are disposed in contact with two opposite edges of the drain region 106 in the first direction D1 and separate from the two opposite second portions 103b of the guard ring 103 respectively. For example, the drain region 106 is separated from the second portion 103b of the guard ring 103 by a gap "g", and the gap "g" is preferably about ⅓ to ½ of a width "W1" of the second doped well 102 in the first direction D1, but is no limited thereto. Also, the width "W1" of the second doped well 102 is substantially smaller than a width "W2" of the drain region 106 as shown in FIG. 1.

The second doped wells 102 preferably have the same depth as the first doped well 101, as shown in FIG. 2. That is, the second doped wells 102 directly contact the substrate 100. Also, each of the second doped wells 102 preferably overlaps with the drain region 106 in the first direction D1. For example, the second doped wells 102 may overlap with a portion of the drain region 106 in a length "W3" as shown in FIG. 1, and the length "W3" is preferably about ⅕ to 1/10 of the width "W2" of the drain region 106. On the other hand, a length "L1" of the second doped wells 102 is smaller than a length "L2" of the drain region 106, preferably about 50% to 70% smaller than the length "L2" of the drain region 106. That is, the second doped wells 102 may not extend over the drain region 106 in the second direction D2.

Through disposing the second doped wells 102 between the second portion 103b of the guard ring 103 and the drain region 106, a parasitic diode "B" may be formed by a PN junction between the first doped well 101 and the second doped wells 102. Since the parasitic diode "B" is formed by the first doped well 101 and the second doped wells 102, and the second doped wells 102 have a relative smaller doped concentration than the drain region 106, the parasitic diode "B" will have a relative greater breakdown voltage in comparison with a NPN bipolar junction transistor (BJT) "A" formed by the drain region 106, the first doped well 101 and the source region 104. Accordingly, if currents flow from an anode 150 to a cathode 170, the NPN BJT "A" may be easier turned on than the parasitic diode "B". Under this arrangement, even a greater charge may be accumulated in the first doped well 101 around the guard ring 103 while a negative ESD is applied, the current path between the second portion 103b of the guard ring 103 and the drain region 106 will not be fast turned on while the negative voltage is shifted to positive voltage. Accordingly, the possible breakdown occurred at the drain region 106 where is close to the second portion 103b of the guard ring 103 may be sufficiently avoided, thereby keeping the ESD protection device 10 from being burn out.

The ESD protection device 10 may also include a gate structure 130 disposed on the first doped well 101 between the source region 104 and the drain region 106. The gate structure 130 may include a gate dielectric layer 131 for example including an insulator like silicon oxide, a gate electrode 133 for example including metal or doped polysilicon, and a spacer 135 for example including silicon oxide, silicon nitride or silicon oxynitride. In this embodiment, two gate structures 130 are disposed as shown in FIG. 1 and the gate electrodes 133 thereof are electrically connected to the cathode 170. Furthermore, at least one isolation structure 110, including a shallow trench isolation (STI) or a field oxide (FOX) for example, is disposed in the substrate 100 for electric isolation. In one embodiment, the at least one isolation structure 110 is disposed to surround the source regions 104 and the drain region 106. For example, one isolation structure 110 is disposed between the guard ring 103 and the source region 104, and another isolation structure 110 is further disposed in the source region 104 and the drain region 106 to isolate the second doped regions 124 of the source regions 104 and the second doped regions 126 of the drain region 106 from the gate structures 130 as shown in FIG. 2. However, in an ESD protection device of another embodiment, the gate structures may also be omitted or replaced by other suitable elements.

According above, the ESD protection device 10 of the present embodiment includes a multi-finger structure surrounded by the guard ring 103, and the first doped well 101, the source regions 104, the drain region 106 and the gate structures 130 together form plural finger elementary MOS transistors, such as a gate ground n-type metal-oxide-semiconductor (GGNMOS), but not limited thereto. Regarding to the ESD protection device 10, an additional second doped well 102 is formed between the second portion 103b of the guard ring 103 and the drain region 106, thereby forming the parasitic diode "B" therebetween for increasing the breakdown voltage. Thus, if currents flow from the anode 150 to the cathode 170, the current path between the second portion 103b of the guard ring 103 and the drain region 106 will not be rapidly turned on, and the electronic element such as contact plugs disposed at the finger edge in the first direction D1 may not be easy to burn out accordingly. In this way, the gap "g" between the second portion 103b of the guard ring 103 and the drain region 106 will no longer be needed to enlarge for increasing the breakdown voltage, and the entire layout may be sufficiently minimized thereby. It is noted that through disposing the additional second doped well 102 in alignment with the drain region 106 in the vertical direction D1, the current paths of ESD protection device 10 are able to be uniformly turned on, so as to obtain better MM performance. For example, the negative mode MM performance of the ESD protection device 10 may reach 575v and the positive mode MM performance of the ESD protection device 10 may reach 350v.

Figure 3:
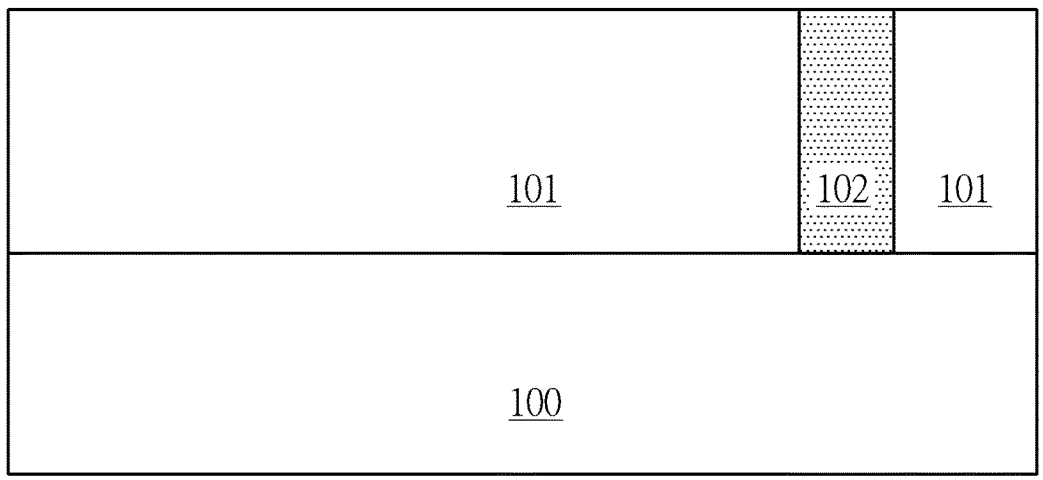
Figure 4:
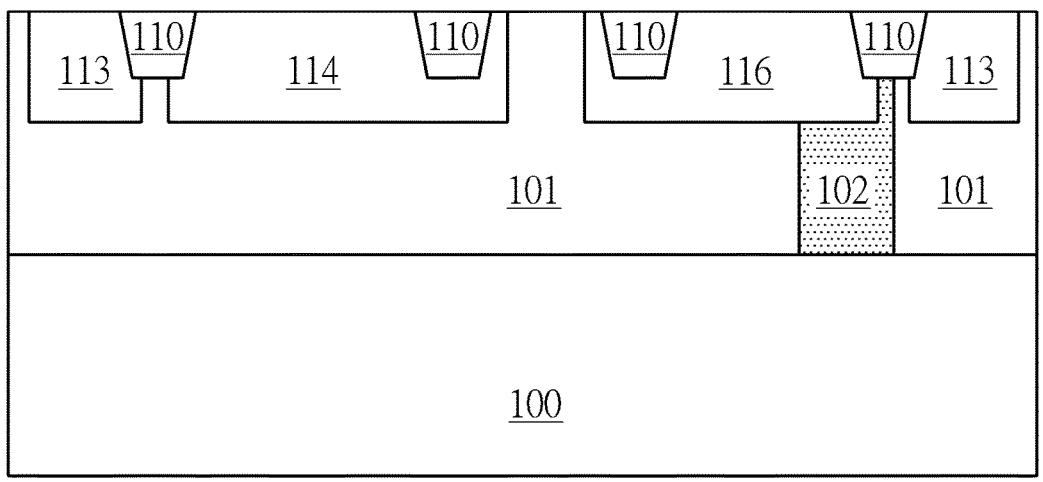
Figure 5:
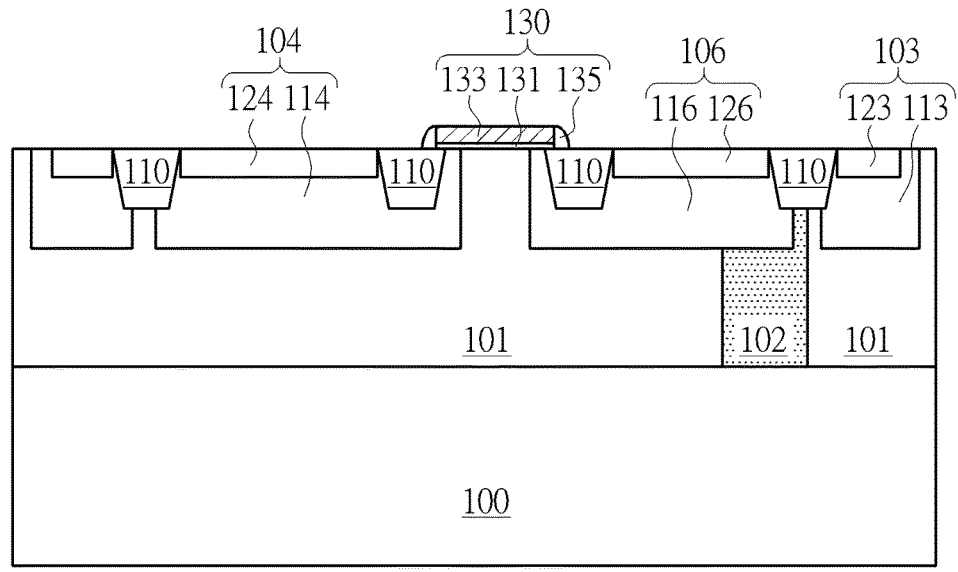

A fabricating method of the aforementioned ESD protection device according to the present invention is further illustrated in FIGS. 3-5. As shown in FIG. 3, the substrate 100 is firstly provided. Then, the first doped well 101 and the second doped well 102 are formed sequentially within the substrate 100. The first doped well 101 has the first conductive type such as p-type, and the second doped well 102 has the second conductive type such as n-type. As shown in FIG. 3, the second doped well 102 is formed to have the same depth as the first doped well 102. That is, the second doped well 102 may directly contact the substrate 100 as shown in FIG. 3.

Next, as shown in FIG. 4, dopant implantation processes are performed to form the first doped regions 114, 116 and the third doped region 113 in the first doped well 101. In one embodiment, the first doped regions 114, 116 may be formed simultaneously to both have the second conductive type, and the third doped region 113 is formed then to have the first conductive type. The methods to form those first doped regions 114, 116 and the third doped region are well known to persons of ordinary skill in the art; therefore, details will not be discussed herein. It is worth of noting that because the first doped regions 114, 116 are formed through the same implantation process, the doped concentration, as well as the depth of the first doped regions 114, 116 are substantially identical as shown in FIG. 4. It is also noted that, the doped concentration of the first doped regions 114, 116 is greater than the doped concentration of the second doped well 102. The fabrication method of the present embodiment further includes forming at least isolation structure 110 such as a STI or a FOX on surface of the substrate 100 to define plural openings (not shown in the drawings) on the substrate 100. In this embodiment, plural isolation structures 110 are respectively formed to surround the source region and the drain region. For example, the isolation structures 110 are formed in the first doped region 114, 116, between the third doped region 113 and the first doped region 114, and between the third doped region 113 and the first doped region 116 as shown in FIG. 4, but not limited thereto.

Then, as shown in FIG. 5, dopant implantation processes are further performed to form the second doped regions 124, 126 and the fourth doped region 123 in those openings respectively, in which the second doped regions 124, 126 may be formed simultaneously in the first doped regions 114, 116 respectively to both have the second conductive type, and the fourth doped region 123 is then formed in the third doped region 113 to have the first conductive type. In this way, the third doped region 113 and the fourth doped region 123 may together form the guard ring 103, the first doped region 114 and the second doped region 124 may together form the source region 104, and the first doped region 116 and the second doped region 126 may together form the drain region 106, as shown in FIG. 5. Preferably, the doped concentration, as well as the depth of the second doped regions 124, 126 are substantially identical. Also, the doped concentration of the second doped regions 124, 126 is greater than the doped concentration of the first doped regions 114, 116. The fabrication method of the present embodiment further includes forming the gate structure 130 on the substrate 100 between the source region 104 and the drain region 106. In this way, the ESD protection device 10 of the present embodiment is obtained.

The following description will detail the different embodiments of the ESD protection device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
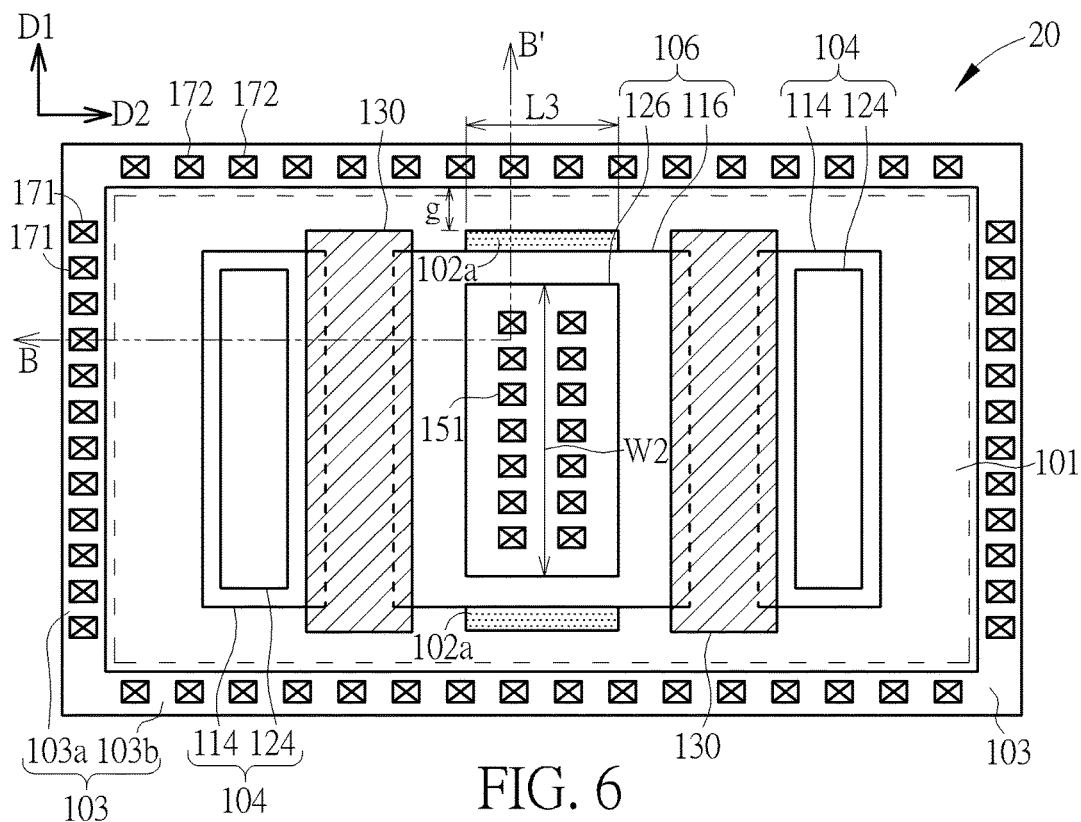
Figure 7:
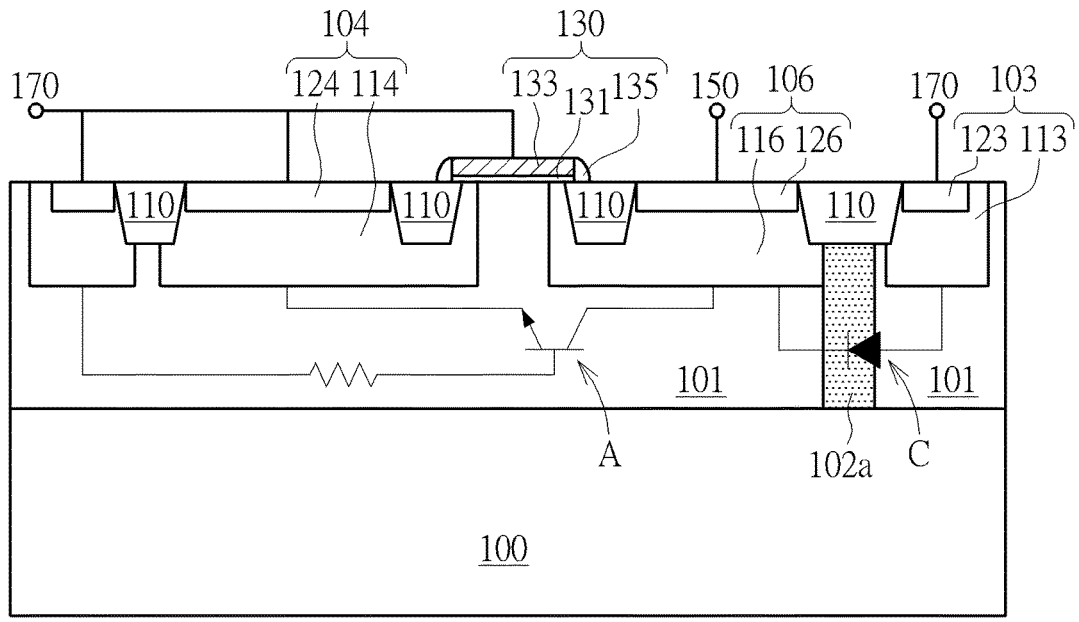

Please refer to FIGS. 6-7, which show schematic diagrams of an ESD protection device 20 according to the second embodiment of the present invention. The structure of the ESD protection 20 is substantially similar to that of the ESD protection device 10 shown in FIGS. 1-2, the differences between these two ESD protection devices 10, 20 are that the second doped well 102a of the present embodiment is disposed only in contact with the edge of the drain region 106 and do not overlap with any portion of the drain region 106. Also, sidewalls of the second doped well 102a are vertically aligned with sidewalls of the drain region 106 in the first direction D1. That is, the second doped well 102a of the present embodiment may have the same length "L3" as the length of the drain region 106 in the second direction D2, as shown in FIG. 6.

Likewise, through disposing the second doped well 102a between the second portion 103b of the guard ring 103 and the drain region 106, a parasitic diode "C" may be formed therebetween for increasing the breakdown voltage. Thus, if currents flow from the anode 150 to the cathode 170, the current path between the second portion 130b of the guard ring 130 and the drain region 106 will not be rapidly turned on, and the electronic element such as contact plugs disposed at the finger edge may not be easy to burn out accordingly. Thus, the current paths of ESD protection device 20 in the present embodiment are also able to be uniformly turned on, so as to obtain better MM performance.

Figure 8:
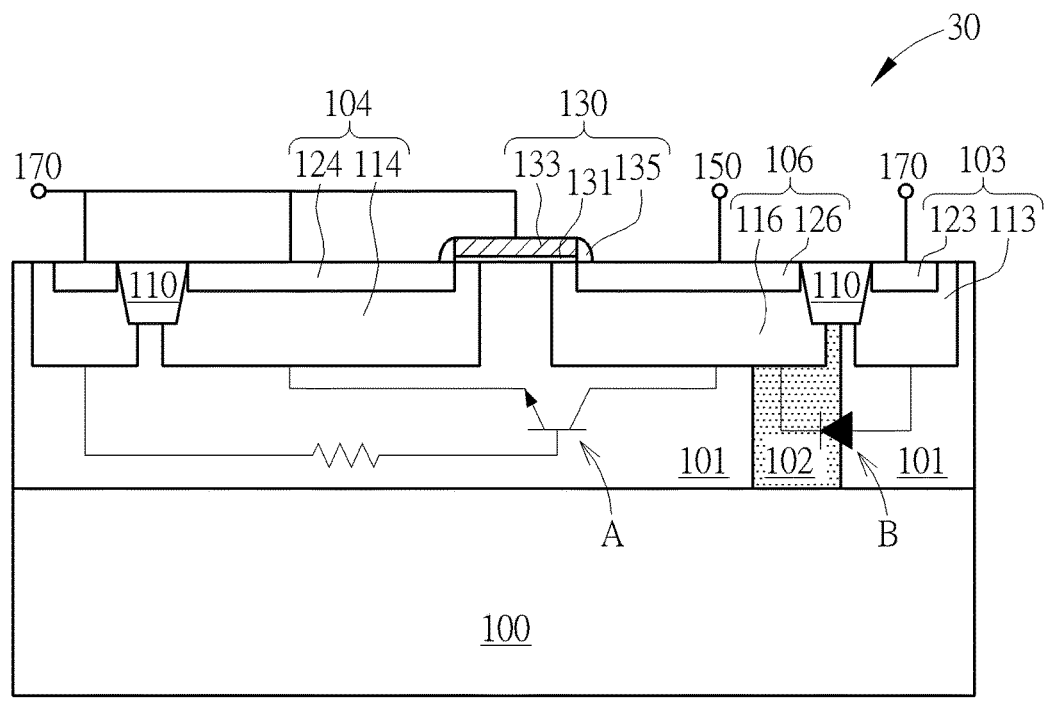
FIG. 8 is a schematic diagram illustrating an electrostatic discharge (ESD) protection device according to a third preferred embodiment of the present invention.

Please refer to FIG. 8, which shows a schematic diagram illustrating a cross section al view of an ESD protection device 30 according to the third embodiment of the present invention. The structure of the ESD protection 30 is substantially similar to that of the ESD protection device 10 shown in FIGS. 1-2, the difference between these two ESD protection devices 10, 30 is that no isolation structure is disposed in the substrate 100 between the gate structure 130 and the first region 114 of the source region 104, and between the gate structure 130 and the first region 116 of the drain region 106. That is, the GGNMOS shown in FIGS. 1-2 is replaced by a symmetric high voltage device (FD NMOS and DDD NMOS). Besides the aforementioned difference, features and functions of the present embodiment are substantially similar to those of the ESD protection device 10 of the first embodiment and will not be redundant described therein.

In summary, the present invention is mainly disposed an additional anti-doped well between the guard ring and the drain region in a vertical direction, with the anti-doped well either in contact with the drain ring or partially overlapping the drain ring in the vertical direction, thereby forming a parasitic diode adjacent to the drain region where is closer to the guard ring for increasing the breakdown voltage thereof. In this way, the current paths around the drain region which is closer to the guard ring will no long be rapidly turned on, and the ESD protection device of the present invention may not be easy to burn out accordingly. Thus, through disposing the additional anti-doped well, the current paths of ESD protection device in the present invention are able to be uniformly turned on, so as to obtain better MM performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection device, comprising:
    a substrate;
    a first doped well disposed in the substrate and having a first conductive type;
    a drain region disposed in the first doped well and having a second conductive type;
    a guard ring disposed in the first doped well and having the first conductive type, the guard ring surrounded the drain region and having a first portion extending along a first direction and a second portion extending along a second direction different from the first direction;
    a first source region disposed in the first doped well and between the drain region and the first portion of the guard ring, the first source region having the second conductive type; and
    a second doped well disposed in the first doped well between the drain region and the second portion of the guard ring, the second doped well having the second conductive type, wherein the second doped well is in contact with the drain region and is disposed at least partially outside the drain region in the first direction.

2. The ESD protection device according to claim 1, further comprising:
    at least one first contact plug disposed on the first portion of the guard ring to be electrically connected to the first portion of the guard ring; and
    at least one second contact plug disposed on the second portion of the guard ring to be electrically connected to the second portion of the guard ring.

3. The ESD protection device according to claim 1, further comprising:
    another second doped well disposed in contact with the drain region, and the another second doped well is disposed between the drain region and the second portion of the guard ring.

4. The ESD protection device according to claim 1, further comprising:
    a second source region disposed in the first doped well, the second source region disposed between the drain region and the first portion of the guard ring.

5. The ESD protection device according to claim 1, further comprising:
    a gate structure disposed on the substrate between the first source region and the drain region.

6. The ESD protection device according to claim 1, further comprising:
    an isolation structure disposed in the first doped well and surrounded the first source region and the drain region.

7. The ESD protection device according to claim 1, wherein a doped concentration of the drain region is greater than a doped concentration of the second doped well.

8. The ESD protection device according to claim 1, wherein the drain region comprises:
    a first doped region disposed in the first doped well; and
    a second doped region disposed in the first doped region.

9. The ESD protection device according to claim 1, wherein a doped concentration of the guard ring is greater than a doped concentration of the first doped well.

10. The ESD protection device according to claim 1, wherein the guard ring comprises:
    a third doped region disposed in the first doped well; and
    a fourth doped region disposed in the third doped region.

11. The ESD protection device according to claim 1, wherein the second doped well has a length being about 50% to 70% smaller than a length of the drain region in the second direction.

12. The ESD protection device according to claim 1, wherein the second doped well has a width smaller than a width of the drain region in the first direction.

13. The ESD protection device according to claim 12, wherein a portion of the second doped well overlaps the drain region and the portion of the second doped well has a length being about ⅕ to 1/10 of the width of the drain region in the first direction.

14. The ESD protection device according to claim 12, wherein the second doped well is separated from the guard ring by a gap being about ⅓ to ½ of the width of the second doped well in the first direction.

15. A method of forming an electrostatic discharge (ESD) protection device, comprising:
  providing a substrate;
  forming a first doped well with a first conductive type in the substrate;
  forming a drain region with a second conductive type in the first doped well;
  forming a guard ring with the first conductive type in the first doped well to surround the drain region, wherein the guard ring has a first portion extending along a first direction and a second portion extending along a second direction different from the first direction;
  forming a source region with the second conductive type in the first doped well between the drain region and the first portion of the guard ring; and
  forming a second doped well with the second conductive type in the first doped well between the second portion of the guard ring and the drain region, wherein the second doped well is in contact with the drain region and is disposed at least partially outside the drain region in the first direction.

16. The method of forming an ESD protection device according to claim 15, further comprising:
  forming at least one first contact plug on the first portion of the guard ring to electrically connect the first portion of the guard ring;
  forming at least one second contact plug on the second portion of the guard ring to electrically connect the second portion of the guard ring; and
  forming a gate structure on the substrate between the source region and the drain region.

17. The method of forming an ESD protection device according to claim 15, wherein a doped concentration of the second doped well is less than a doped concentration of the drain region.

18. The method of forming an ESD protection device according to claim 15, wherein the forming of the drain region comprising:
  forming a first doped region in the first doped well; and
  forming a second doped region in the first doped region.

19. The method of forming an ESD protection device according to claim 15, wherein the second doped well is formed to overlap the drain region in the first direction, and an overlapped portion of the second doped well is about ⅕ to 1/10 of a width of the drain region in the first direction.

20. The method of forming an ESD protection device according to claim 15, wherein a doped concentration of the guard ring is greater than a doped concentration of the first doped well and the forming of the guard ring comprises:
  forming a third doped region in the first doped well; and
  forming a fourth doped region in the third doped region.

* * * * *